United States Patent [19]
Hynecek

[11] Patent Number: 4,673,963
[45] Date of Patent: Jun. 16, 1987

[54] HIGH WELL CAPACITY CCD IMAGER

[75] Inventor: Jaroslav Hynecek, Richardson, Tex.

[73] Assignee: Texas Instruments Incorporated, Dallas, Tex.

[21] Appl. No.: 770,323

[22] Filed: Aug. 27, 1985

[51] Int. Cl.⁴ .................. H01L 29/78; G11C 19/28
[52] U.S. Cl. ................................. 357/24; 377/58; 377/61
[58] Field of Search .............. 357/24, 30; 377/57–63

[56] References Cited

U.S. PATENT DOCUMENTS 4,229,752 10/1980 Hynecek .............................. 357/24
4,365,261 12/1981 Chatterjee et al. .................. 357/24

OTHER PUBLICATIONS

Hobson *Charge-Transfer Devices* Edward Arnold, London, 1978, pp. 20–27.

Primary Examiner—Gene M. Munson
Attorney, Agent, or Firm—Richard A. Bachand; N. Rhys Merrett; Melvin Sharp

[57] ABSTRACT

A CCD imager of small geometry which has increased well capacity. An additional p-type implant 112 selectively located creates a p-type region 112 below the channel region 13 of the virtual well regions 34, which increases the capacitance in the virtual well regions 34.

2 Claims, 8 Drawing Figures

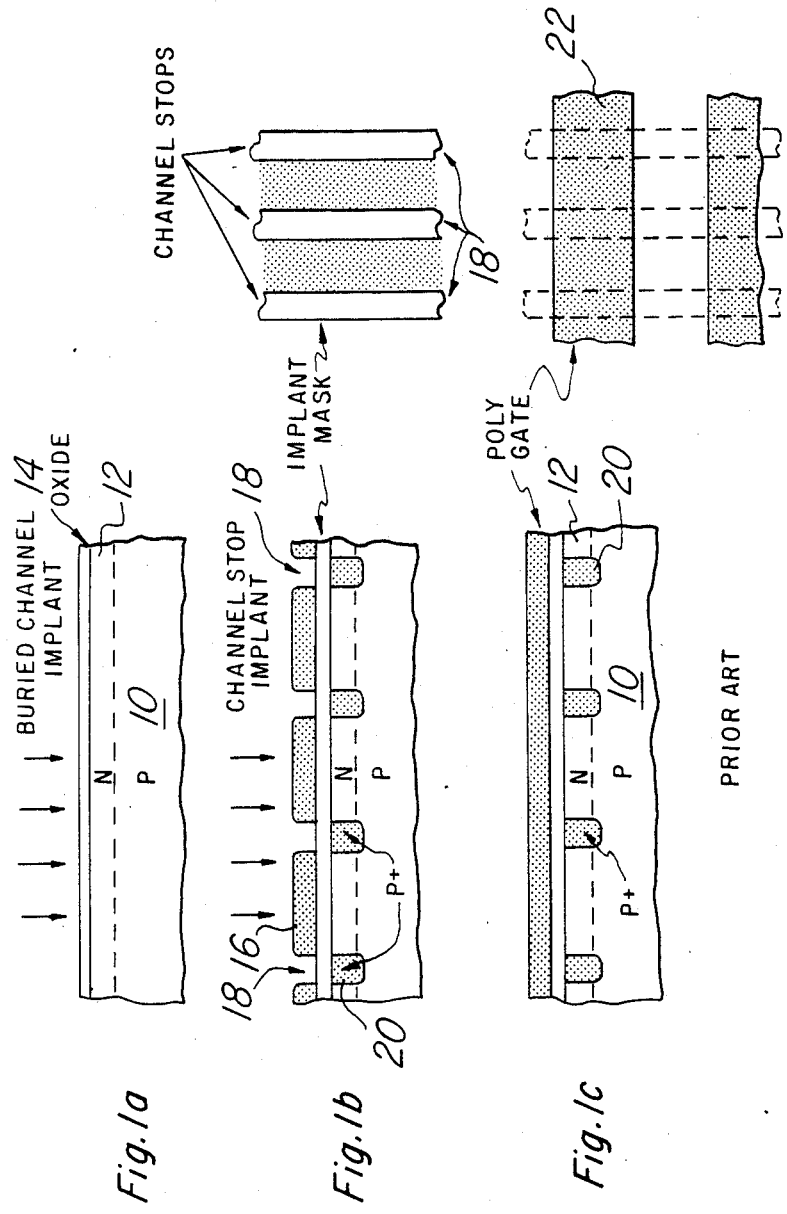

HIGH WELL CAPACITY CCD IMAGER

CROSS-REFERENCE TO RELATED APPLICATIONS

The following patent applications, assigned to the assignee hereof contain related subject matter, and all are hereby incorporated by reference:

Ser. No. 770,325 filed Aug. 27, 1985;
Ser. No. 770,111 filed Aug. 27, 1985;
Ser. No. 770,322 filed Aug. 27, 1985;
Ser. No. 770,112 filed Aug, 27, 1985;
Ser. No. 770,337 filed Aug. 27, 1985;
Ser. No. 770,326 filed Aug. 27, 1985;
Ser. No. 770,321 filed Aug. 27, 1985.

BACKGROUND AND SUMMARY OF THE INVENTION

The present invention relates to CCD imagers. The present invention particularly relates to CCD technologies, such as virtual phase, wherein one phase is a DC phase.

Higher well capacity in CCD imagers is generally highly desirable, to improve dynamic range. In particular, in virtual phase technology, it is desirable to increase the virtual phase well capacity, if only to permit increases in the capacity of the clocked well too. This could be accomplished by patterning the virtual phase well with larger dimensions, but of course this would be undesirable. Naturally, the ability to provide larger capacitance for the same dimensions also means that dimensions may be made smaller for the same capacitance.

The present invention teaches that higher well capacity, in the DC phase region of any CCD technology (such as virtual phase) which uses a DC phase, can be achieved by using a deep p-type implant to produce a p+ region (or, more precisely, a p-type region having a substantially higher concentration than the p-type substrate background level) underneath the n-type channel region (which itself is underneath the shallow p+ virtual phase electrode, in virtual phase technology).

The present invention also teaches that higher well capacity in the diffused-gate-phase region of any CCD technology which uses both diffused-gate-phase regions and patterned-gate-phase regions can be achieved by using a deep blanket p-type implant to produce a p+ region (or, more precisely, a p-type region having a substantially higher concentration than the p-type substrate background level) underneath the n-type channel region in the diffused-gate-phase regions.

The depletion width of the interface between channel and substrate can thus be substantially reduced, and the channel to substrate capacitance is accordingly increased. Up to 100% improvement in capacitance is possible using this method. This implies higher well capacity.

A deep p-type implant under an n-type region (referred to as a "Hi-C implant") has long been known in DRAM technology as a way to get more capacitance. However, in CCD technology use of such a deep implant under the channel generally would cause difficulties: the voltage swings required of a clocked electrode over such a Hi-C implant would be increased, contrary to the general efforts to reduce the magnitude of the drive voltages.

Thus, the present invention is particularly advantageous in virtual phase CCD technology; but it is also advantageous in any technology where at least one phase is clocked and at least one other is DC, or in any CCD technology where at least one phase uses an insulated gate electrode (or some other type of patterned electrode) and at least one other phase uses a diffused electrode (or some other type of electrode, such as a self-aligned silicide, which is too thin to stop the channel-stop implants).

The deep P implant is preferably performed after the patterned-gate-phase electrode has been patterned, so that this implant can be unmasked within the CCD array. The patterened-gate-phase electrode (which may be, e.g., of polysilicon, or may be a sandwich structure such as polysilicon/$SiO_2$ or polysilicon/indium tin oxide) protects the regions under it from the deep implant.

Thus, it is an advantage of the present invention that the capacity of the DC phase well region is increased, with no increase in its dimensions.

It is a further advantage of the present invention that the capacity of the DC phase well region is increased, with no increase in required clock voltage magnitudes of the clocked electrodes.

It is a further advantage of the present invention that the dimensions of the DC phase well region can be reduced without reducing the capacitance of the well.

It is a further advantage of the present invention that the capacity of the DC phase well region is increased, with no increase in required clock voltage magnitudes of the clocked electrodes.

It is a further advantage of the present invention that the capacity of the DC phase well region is increased, without any required increase in the number of patterning steps during fabrication.

It is a further advantage of the present invention that the capacity of the DC phase well region is increased, with no increase in required clock voltage magnitudes of the clocked electrodes nor in dimensions.

The "DC phase" referred to may of course not be entirely DC, since parasitic resistances and capacitances will commonly lead to small voltage swings even in unclocked regions; therefore the references to "DC phase" in this application should be construed more broadly to refer to any phase which is not clocked, regardless of whether it is held at a DC potential or permitted to float to some extent.

According to the present invention there is provided: A CCD device comprising: a substrate having a p-type crystalline semiconductor upper portion containing a plurality of CCD elements connected in series, each said CCD element comprising a clocked phase portion and a DC phase portion, each of said clocked phase portions and each of said DC phase portions including both a well region and a barrier region, at least some of said well regions of said DC phase portions comprising both an n-type channel region and a p-type capacitance-enhancing region thereunder, said p-type capacitance-enhancing region having a higher doping concentration than said semiconductor upper portion.

BRIEF DESCRIPTION OF THE DRAWING

The present invention will be described with reference to the accompanying drawings, wherein:

FIGS. 1A–1C show an example of a prior art method of making a CCD, in which the channel stops extend uniformly under the clocked and virtual gates.

DESCRIPTION OF THE PREFERRED EMBODIMENTS

Figure 2A:
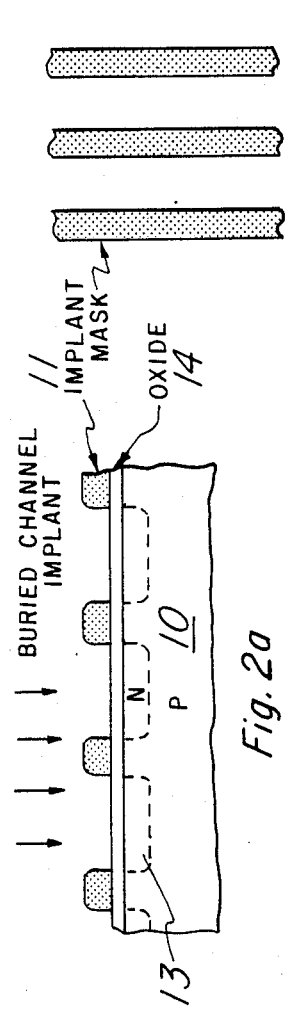
FIGS. 2A–2C show key steps in a novel method of making a CCD, using a two-mask channel definition process.

The process preferably used in manufacturing devices in accordance with various of the points of novelty taught by the present application will first be described in detail.

Processing

FIGS. 1A–1C shows an example of a prior art method of making a CCD. A p-type substrate 10 has an oxide 14 grown on it, and then a blanket buried channel implant forms a surface layer 12 which is n-type. (Alternatively, the surface layer 12 may be grown epitaxially instead of implanted.) An implant mask 16 is patterned to expose channel stop locations 18. P-type implantation then results in the formation of p+ channel stops 20, as shown in FIG. 1B. Finally, clocked wells are implanted, and the poly gate 22 is patterned across the lines of channel stops. The patterning of the poly gate 22 defines the location of the clocked phases along the channels.

Figure 2B:
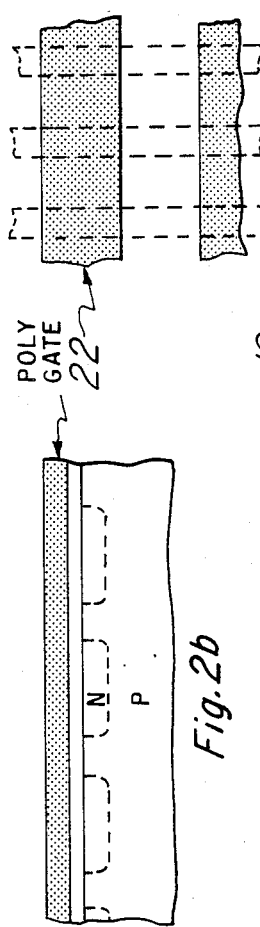
Figure 2C:
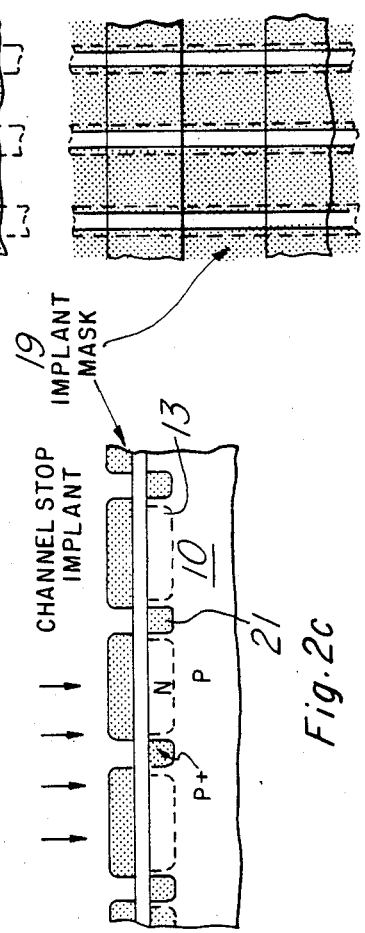

In the present invention, an extra mask step is added, and the order of the steps is changed, to produce substantial advantages. Key steps in the process of the present invention are shown in FIGS. 2A–2C. The first difference, as shown in FIG. 2A, is that the buried channel implant is patterned by an implant mask 11, to produce patterned channels 13 as opposed to the blanket layer 12 using the prior art. Then (after the clocked wells have been formed), the poly gate 22 is patterned, as shown in FIG. 2B. Next, a channel stop implant is screened by an implant mask 19, to produce patterned p+ channel stop regions 21 as shown in FIG. 2C.

Thus, since the channel stop implant is applied after the poly gate 22 has been patterned, the p+ channel stops 21 do not extend continuously along the full region of the channel, but are interrupted every time they are intersected by a portion of a poly gate level 22. This means that the width of the channel diffusion 13 under the poly gate 22 is increased, since there is no p+ region 21 to outdiffuse in these regions. This means that the capacity of the clocked well is increased.

To correspondingly increase the capacity of the virtual phase well, one additional (Hi-C) implant is preferably performed. This is a deep p-type implant, with a stopping distance near or below the bottom junction location which will be defined by the doping profile of the buried channel locations 13. Thus, the capacity of both virtual phase and clocked phase is increased.

The foregoing description summarizes a few of the key features which distinguish the present invention from the prior art. The fabrication process will now be discussed in great detail, with primary reference to the CCD array. Additional masks and fabrication steps may be used for fabrication of the periphery, including some which are entirely conventional in NMOS logic and will not be discussed in any great detail. Also, many minor processing steps (such as cleanups, growth of anti-Kooi-effect oxide, stripping of masks, etc.) are omitted, because they are very widely known and their insertion at appropriate points is obvious to one skilled in the art.

The following specific implant dose and energy specifications are illustrative only, provided to better permit one skilled in the art to make and use the various inventions disclosed, and do not limit the scope of the invention. In particular, the currently preferred ranges for dose and energy are given; but, as is well known to processing engineers, such specifications may be very widely varied. Many of the parameters given may be varied by plus or minus 50% or more, depending on the tradeoffs exploited by the process engineer. As is well known, there are innumerable tradeoffs between the parameters of any one implant step and oxide thicknesses, supply voltage, annealing conditions, the parameters of other implant steps, etc. Moreover, many substitutions of technologies can be made (to name only one example, sidewall masked isolation could be used instead of LOCOS), and steps can be interchanged and modified as well.

Many parts of the specification hereof have particular reference to a process which uses virtual phase CCD technology. Background on virtual phase CCD technology can be found in the following articles, all of which are hereby incorporated by reference: Hynecek, "Virtual Phase Technology: a New Approach to Fabrication of Large-area CCDs," 28 IEEE Transactions on Electron Devices 483 (1981); Hynecek, "Electron-Hole Recombination Antiblooming for Virtual-Phase CCD Imager," 30 IEEE Transactions on Electron Devices 941 (1983); Hynecek, "Design and Performance of a Low Noise Charge Detection Amplifier for VPCCD Devices," 31 IEEE Transactions on Electron Devices 1713 (1984); Hynecek, "Design and Performance of a High-resolution Image Sensor for Color TV Applications," forthcoming in the August 1985 issue of IEEE Transactions on Electron Devices; and U.S. Pat. No. 4,229,782, which is also hereby incorporated by reference.

However, many of the innovations described are perfectly applicable to other CCD technologies as well. Virtual phase technology is referred to so extensively merely because (1) it represents the currently contemplated best mode of using the various inventions described, and (2) it is often more advantageous to apply various innovations described here in the context of virtual phase technology than it would be in the context of other CCD technologies; i.e. the innovations are applicable and advantageous in many other technologies, they are simply more advantageous in virtual phase technology.

The processing sequence preferably used will now be described in detail.

A substrate having a monocrystalline semiconductor upper portion, for example a p-on-p+ silicon wafer having a 10 micron thick epitaxial layer doped to around $1 \times 10^{15}/cm^3$ p-type, is provided as starting material.

The first masking step used is a moat masking step. This is used, as is conventional, to pattern a silicon nitride masking layer; the openings in the nitride layer expose selected regions to a LOCOS-channel-stop implant (e.g. $1 \times 10^{14}/cm^2$ of boron at 60 keV) and then to a long oxidation, in order to form LOCOS isolation surrounding moat regions (moat regions are the regions where active devices are to be formed) in the periphery. Since no oxide isolation is needed in the CCD array, the whole array is masked from the field oxidation steps.

Next, a source/drain mask is used to mask off the entire CCD array (except for diode locations, such as the clearing diodes along the top and bottom edges of the array), so that an n+ source/drain implant can be used to form NMOS devices in the periphery. This implant may be, for example $3 \times 10^{15}/cm^2$ to $7 \times 10^{15}/cm^2$ of phosphorus at 30–60 keV. Note that this is not a self-aligned source-drain implant, as used in most MOS processes: the virtual well implant will later be used to form source/drain extensions (LDD regions) which are self-aligned to the poly gate level. (This mask is also used to mask a plasma etch which strips the LOCOS nitride from exposed portions of the moat (in the periphery) and from the exposed portions of the CCD array. The portion of the LOCOS nitride under this mask can be removed by wet etching later.) The use of a masked source/drain implant not only provides low-resistance diffused interconnects and LDD structures (which reduce hot-electron problems), but also is advantageous if JFET devices are used in the periphery: the masked source/drain implant means that the JFET channel regions can be screened from this implant. Instead of implanting, this step of introducing dopants may be performed as a POCl$_3$-deposition step instead.

Next, implant mask 11 is patterned to expose the CCD channel regions, and an implant of $1 \times 10^{12}/cm^2$ to $2 \times 10^{12}/cm^2$ of phosphorus at 100–150 keV is applied to form buried channel regions 13, as shown in FIG. 2A.

Next an arsenic implant of $2 \times 10^{14}/cm^2$ to $4 \times 10^{14}/cm^2$ at 20–30 keV is applied to form clocked wells.

Next, gate oxide 14 is grown on all exposed areas of silicon, to a thickness of, for example, 700 Å, and poly gate 22 is patterned.

Next, a channel stop implant mask 19 is used to expose channel stop regions 21 to a p-type implant, for example, $1 \times 10^{13}$/per cm$^2$ to $5 \times 10^{13}$/per cm$^2$ of boron at 100–200 keV.

Next, a virtual well implant, for example $1.3 \times 10^{12}/cm^2$ of phosphorus at 200 keV, is performed into areas 34. As discussed above, if it is necessary to create potential gradients within some or all of the virtual wells, the mask for this implant step may be modified to include wedge-shaped extensions, and the mask itself may be split, i.e. an additional mask level may be used to separately pattern both an upper virtual well and a lower virtual well. However, use of this additional mask is not presently preferred.

Next, a blanket virtual barrier implant, for example $1.4 \times 10^{12}/cm^2$ of phosphorus at 300 keV, is preferably performed overall.

The virtual well, virtual barrier, and channel stop implants can be performed in any order. However, one useful and novel teaching of the present application is that the channel stop implant should be patterned after the poly gate 22 has been patterned.

Next, a deep p-type implant, for example $2 \times 10^{12}/cm^2$ of boron at 200 keV or more, is preferably performed. This implant functions as a "Hi-C" implant to increase the capacity of the virtual well locations. This implant is not masked in the array, but may be masked in the periphery to provide control over the turnoff characteristics of the JFET devices and avoid degrading the diode breakdown of the n+ source/drain diffusions.

It is preferable that the gate level 22 be thick enough to stop this implant and the channel stop implant. However, stopping boron at more than 100 keV requires a significant thickness of polysilicon, and this conflicts with another goal: to boost quantum efficiency, it is desirable to have the polysilicon gate 22 thin enough to be partially transparent, so that at least some photocarriers can be collected in the clocked wells (in addition to the virtual wells) during the frame exposure period of the imaging array. This will not be practical unless the gate 22 is reasonably thin, e.g. half a micron or less.

To avoid this dilemma, a further novel teaching of this application is that the gate structure should include a thick transparent oxide (not shown) overlying the polysilicon 22. This layered structure is patterned by conventional stack-etching methods. For example, the gate may be polysilicon 2000 Å to 3000 Å thick and doped to a sheet resistance of around 20 to 100 ohms per square, and the transparent oxide may be CVD or plasma oxide, and be at least 2000 Å to 5000 Å thick. Reducing the thickness of the poly increases its transparency and assists in collecting photocarriers in the clocked wells during the exposure interval, thereby raising the quantum efficiency.

Next, a high-dose low-energy boron implant (which also is blanket in the array, but selectively masked in the periphery) is used to form the virtual phase electrode. This step can also be employed to form the gates of JFETs in the periphery if desired. This implant may be, for example, $6 \times 10^{12}/cm^2$ of boron at 35 keV.

Figure 3:
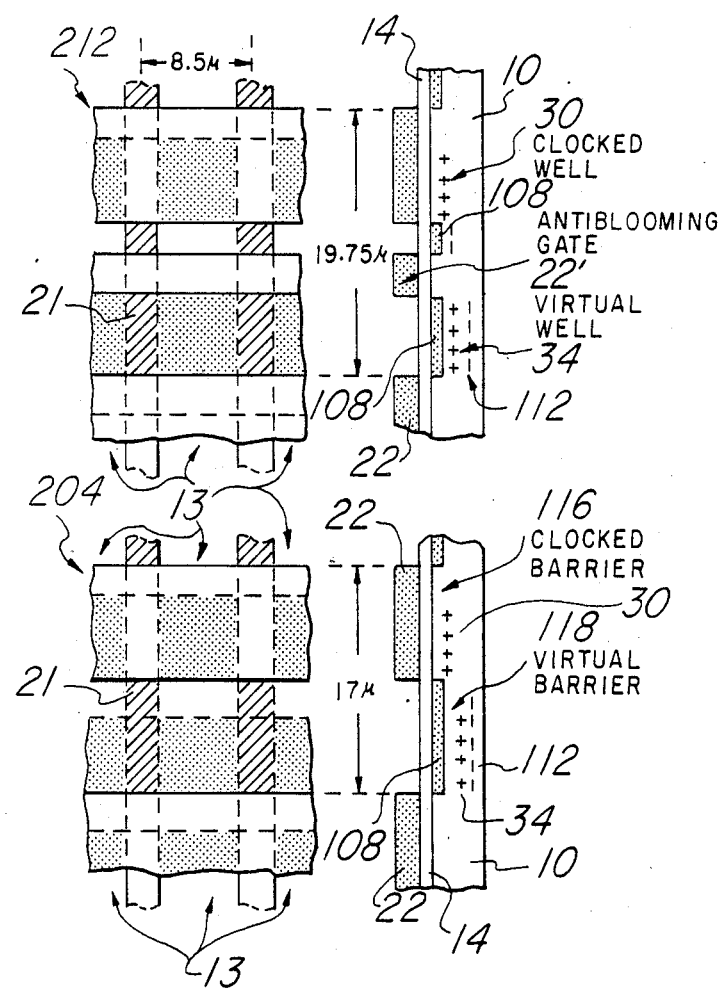
FIG. 3 shows plan and section views of CCD cells in an image area (the top portion of the figure) and storage area (the bottom portion of the figure), in accordance with the invention.
Figure 4:
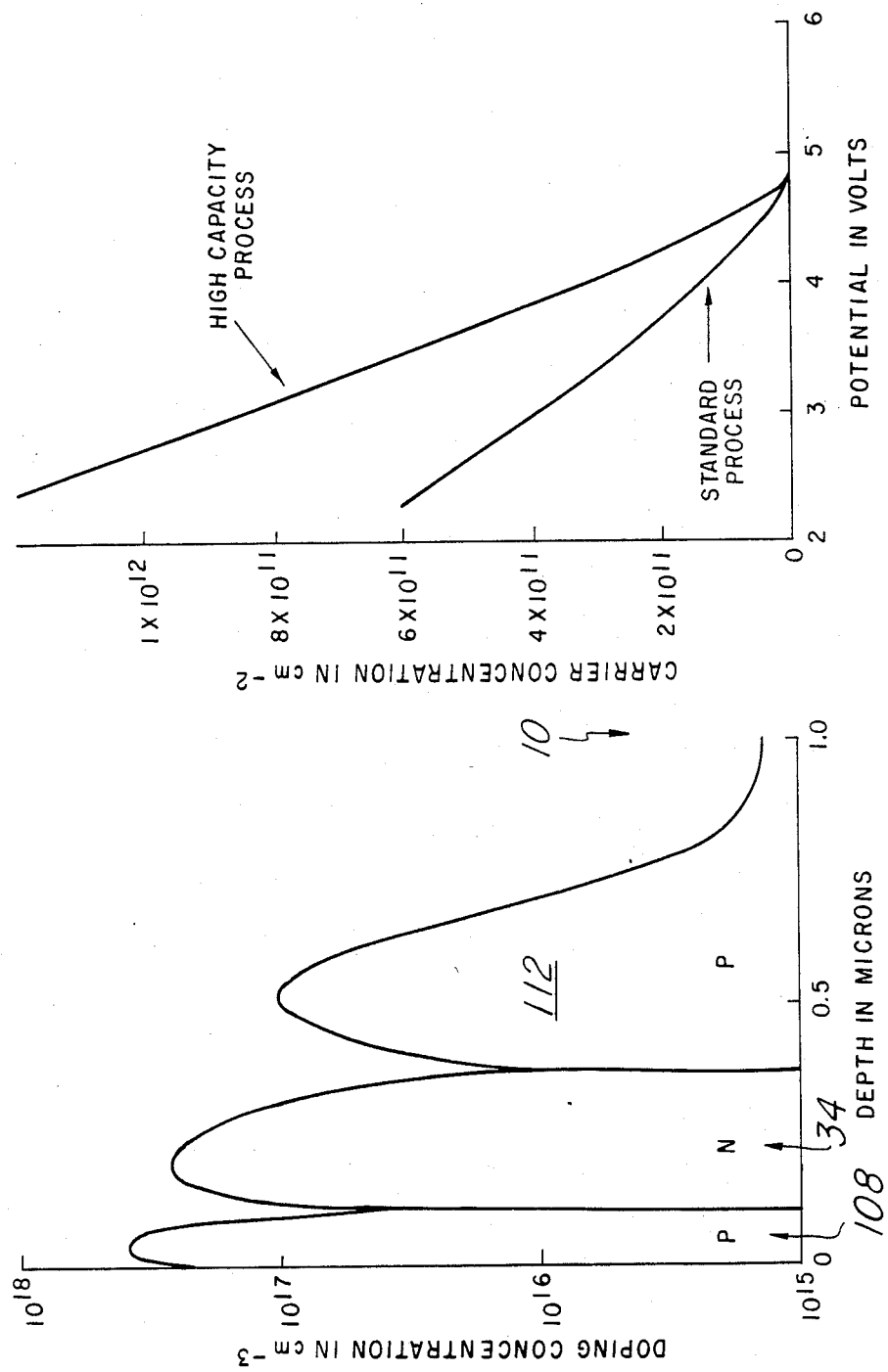
FIG. 4 shows doping profiles and the corresponding charge-potential curve for a new high-well-capacity CCD process using deep p-type regions 112 as shown in FIG. 6. A charge-potential curve for a standard process is shown for a comparison.

FIG. 3 shows plan and section views of CCD cells in the image area 212 (the top portion of the figure) and storage area 204 (the bottom portion of the figure). In the image area 212, the poly level 22 is used not only to form the gates of the cells but also to form antiblooming gates 22'. During the virtual phase, i.e. when all the signal charge should be in virtual well locations if it is not overflowing due to blooming, the antiblooming gate can be briefly clocked negative to charge up interface states beneath its oxide with holes (accumulated from the virtual electrode and from the substrate). The antiblooming gate can then be clocked positive to collect stray electrons, which recombine with the holes stored in the interface states. Antiblooming operation is discussed in much greater detail in Hynecek, 30 IEEE Transactions on Electron Devices page 941 (1983), which is hereby incorporated by reference.

The process discussed has created channel regions 13, which are separated by channel stops 21 outside of the poly gate locations 22, and by the background doping of the substrate 10 underneath the poly gates 22. Underneath each poly gate 22 is a clocked barrier 116 and a clocked well 30. The clocked well 30, created by a patterned arsenic implant as discussed above, creates a localized space charge from the ionized implanted arsenic atoms. (In the diagram of FIG. 3, all implants are shown by their net space charges, i.e., p-type implants are shown as negative charges and n-type implants are shown as positive charges.) Underneath the virtual phase electrode 108 (which is created by a blanket boron implant, as discussed above) are virtual barrier portions 118 and virtual well portions 34 (as mentioned above, the virtual well protions 34 are preferably created by a patterned phosphorus implant, and a blanket phosphorus implant is preferably used to create the virtual barrier 13.) (Note that, in the image area 212, the antiblooming gate 22' separates the virtual barrier region 118 from the virtual well region 34.) A deep blanket p-type implant 112 is also preferably used under the virtual well implant, to enhance its capacitance. Since this implant is preferably performed as a blanket implant, it also increases the concentration of the p-type substrate directly underneath the virtual barrier regions.

As will be recognized by those skilled in the art, the present patent application teaches numerous broadly applicable concepts in CCDs. These concepts may be embodied in a tremendous variety of device, processing, and system embodiments, and the scope of the present invention is accordingly not limited except as specified in the claims.

What is claimed is:

1. A charge coupled device (CCD) comprising:
   a substrate having a p-type crystalline semiconductor upper portion containing a plurality of CCD elements connected in series, each said CCD element comprising a clocked phase portion and a direct current (DC) portion,
   each of said clocked phase portions and each of said DC phase portions including both a well region and a barrier region,
   said well regions of said DC phase portions comprising an n-type channel region,
   and a p-type capacitance-enhancing region selectively located under said well regions of said DC phase portions, and not under said clocked phase portions, having a higher doping concentration than said semiconductor upper portion,
   whereby said clocked phase portion can be clocked both positively and negatively with respect to a ground potential.

2. The device of claim 1, further comprising
   a shallow and relatively highly-doped p-type diffusion in said semiconductor upper portion overlying said DC phase portions.

* * * * *